US006236087B1

(12) United States Patent
Daly et al.

(10) Patent No.: US 6,236,087 B1
(45) Date of Patent: May 22, 2001

(54) SCR CELL FOR ELECTRICAL OVERSTRESS PROTECTION OF ELECTRONIC CIRCUITS

(75) Inventors: Michael P. Daly, Newtownmountkennedy; Denis Ellis, Patrickswell; Keith A. Moloney, Crecora; Liam J. White, Patrickswell; Brian A. Moane, Ballykeeffe; Kieran Heffernan, Patrickswell; Denis Joseph Doyle, Limerick; Michael G. Tuthill, Raheen Cross; David John Clarke, Patrickswell, all of (IE)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 09/184,924

(22) Filed: Nov. 2, 1998

(51) Int. Cl.[7] .................................................. H01L 23/62
(52) U.S. Cl. ........................... 257/355; 257/356; 257/362
(58) Field of Search .................................. 257/355, 356, 257/357, 360, 362

(56) References Cited

U.S. PATENT DOCUMENTS

| 5,012,317 | * | 4/1991 | Rountre .................................. 357/38 |
| 5,181,091 | * | 1/1993 | Harrington, III et al. ............ 257/355 |
| 5,268,588 | * | 12/1993 | Marum ................................. 257/362 |
| 5,341,005 | * | 8/1994 | Canclini ............................... 257/173 |
| 5,844,280 | * | 12/1998 | Kim ..................................... 257/355 |
| 5,932,898 | * | 8/1999 | Dikeman et al. ..................... 257/173 |
| 5,994,741 | * | 11/1999 | Koizumi et al. ...................... 257/355 |

* cited by examiner

Primary Examiner—Matthew Smith
Assistant Examiner—Lex H. Malsawma
(74) Attorney, Agent, or Firm—Wolf, Greenfield & Sacks, PC

(57) ABSTRACT

An input protection device is provided for protecting a circuit structure which is coupled to a first node, the device comprising a first lightly-doped region of P-type material with a lightly doped well of N-type material formed in it. Two regions of heavily doped N-type and P-type material, which are electrically connected to the first node, are formed in the well of N-type material. A third heavily doped region of N type material is formed in the first lightly-doped region of P-type material and is electrically connected to a reference node. In a first aspect of this invention, the third heavily doped region of N type material is formed in a second well of N-type material, which in turn is formed in the first lightly-doped region of P-type material. In this first aspect of the invention a further region of heavily doped P-type material is formed in the second well of N-type material, this further region of heavily doped P-type material being electrically connected to the reference node. In a second aspect to the invention, a further region of heavily doped P-type material is formed in the first lightly-doped region of P-type material. In a third aspect to the invention, the third heavily doped region of N type material is formed in a second well of N-type material, which in turn is formed in the first lightly-doped region of P-type material. In this third aspect of the invention a further region of heavily doped P-type material is formed in the second well of N-type material, this further region of heavily doped P-type material being electrically connected to the reference node, with a further region of heavily doped P-type material formed in the first lightly-doped region of P-type material. Accordingly, an input protection device for protecting pins of an integrated circuit is described having both bipolar and unipolar characteristics. The input protection device may be constructed as a discrete device or as part of an integrated circuit and provides for breakdown voltages in excess of a supply voltage to an integrated circuit. The characteristics, in particular the breakdown voltage, of the input protection device are alterable by adjusting its layout, in contrast to a known method of altering such characteristics by altering doping levels.

31 Claims, 7 Drawing Sheets

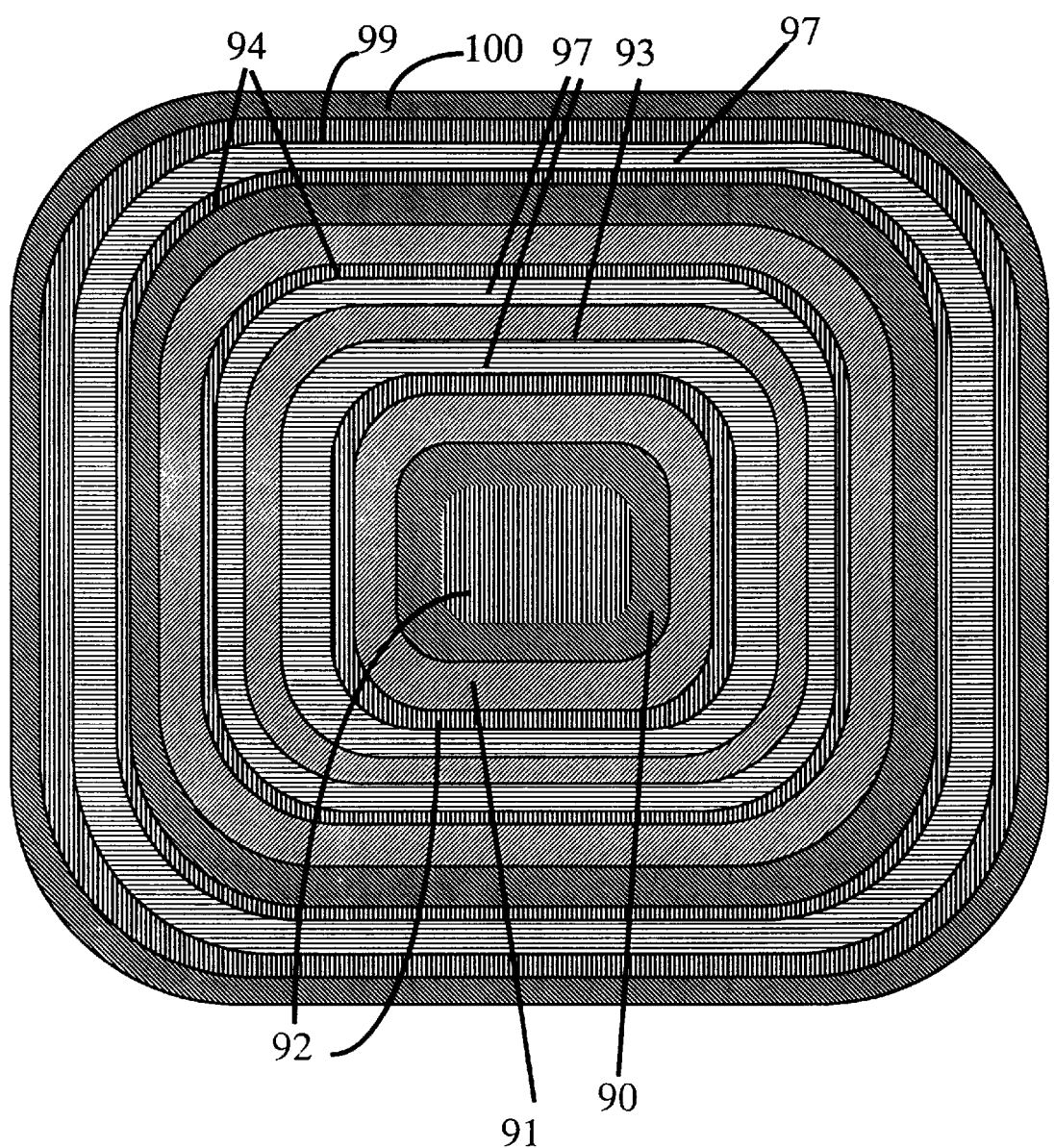
Figure 11
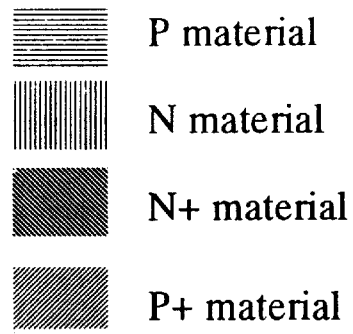

SCR CELL FOR ELECTRICAL OVERSTRESS PROTECTION OF ELECTRONIC CIRCUITS

BACKGROUND OF THE INVENTION

1. Field of the Invention

The present invention relates to input protection circuitry for sensitive electronic circuits. More specifically, the present invention relates to the protection of integrated circuits from electrical overstress and in particular electrostatic discharge.

2. Description of the Prior Art

Integrated circuits are vulnerable to electrical overstress (EOS). EOS results from an external source discharging large transient voltages onto one or more pins of an integrated circuit. These transient voltages can include very fast transients such as those produced by an electrostatic discharge (ESD), or slower transients such as may result from powerline surges.

ESD is a well known cause of failure in integrated circuits, especially integrated circuits manufactured using CMOS processes, but also, albeit to a lesser extent, those produced by bipolar processes. In CMOS devices, the thin oxide layer of input gates cannot support high voltages without incurring damage. In bipolar devices, where the input voltage is across a junction, breakdown damage occurs when the EOS current becomes excessive.

Input protection circuits are frequently used in integrated circuits to protect against such failures. A typical input protection scheme employed is shown in schematic representation in FIG. 1. The scheme shown provides a protection circuit 2 incorporated into an integrated circuit. A similar arrangement may however be applied to the manufacture of discrete electronic devices. In the arrangement shown, a pin 1, which is used for transferring electronic signals from a main structure 3 of the integrated circuit to other electronic devices in the form of either voltages or currents, is shown connected to an ESD protection circuit 2. Although these circuits are referred to as input protection circuits, the term "input" means any electrical connection on the integrated circuit package capable of connecting the integrated circuit to external circuits. Input protection circuits are not to be understood as only protecting pins which provide the integrated circuit with input signals. Pin 1 is subsequently referred to as "the protected pin". The ESD protection circuit 2 is further connected to a voltage reference signal 4, e.g. ground, or the positive or negative voltage supply. In an integrated circuit, the protected pins are the external pins or legs of the integrated circuit package. These external pins/legs are typically connected electrically via bond wires to pads on the surface of the integrated circuit. Pads are areas of metal on the surface of the integrated circuit. Metal tracks electrically connect the pads to other parts of the integrated circuit. For input pins, the pads are typically connected to resistors which in turn are connected to the gates of MOS transistors or the bases of bipolar transistors. With output pins, the pads are typically connected to sources or drains of MOS transistors or to the collectors or emitters of bipolar transistors.

The ESD protection circuit 2 provides a low impedance path from the protected pin 1 to the ground or reference point 4 during an over-voltage event, e.g. an ESD discharge. This low impedance path minimises or eliminates damage to the integrated circuit 3. The purpose of the input protection circuit is to provide a low impedance path to ground (or indeed any arbitrary node), for discharge of any voltage transient, thus preventing damage to the integrated circuit.

Several approaches to EOS protection circuits have been developed. One approach uses diode connected devices, which may include diode connected bipolar devices having their emitter shorted to their base and diode connected MOS devices having their gate connected directly, or via a resistance, to their source. These types of devices are typically connected between each input/output pin of an integrated circuit and one or more voltage reference pins. These types of protection device restrict however input voltages to within one or two diode voltage drops of the reference voltage to which they are connected. In addition, these types of circuit are unreliable for higher levels of ESD voltages.

A further approach uses back-to-back diodes connected between each input/output pin and a reference pin. This arrangement allows input voltages to exceed the reference voltage. However, large diodes are required in order to provide effective protection at lower levels of ESD. Back-to-back diodes are unsuitable for handling higher levels of ESD.

Another approach to input protection uses Silicon Controlled Rectifier (SCR) cell structures. Protection arrangements using SCR structures are described in U.S. Pat. Nos. 5,751,525 and 4,939,616. A typical example of an SCR cell is shown in FIG. 2. The illustrated SCR cell is formed in a portion of a P-type silicon semiconductor substrate 14. It will however be immediately apparent to those experienced in the art that an N-type version of this device may also be implemented. As shown, a lightly doped N-well 15 is formed in the substrate 14. The N-well 15 has a first heavily doped region of N-type material 17 and a second heavily doped region of P-type material 16 formed in it. These two heavily doped regions 16, 17 are electrically connected to the protected pin 1 and to the circuit structure 3. A further region of heavily doped N-type material 19 is located in the P type substrate 14 at a spacing from the N-well 15. This further region 19 of heavily doped N-type material is electrically connected to ground. Alternatively, this further region of heavily doped N-type material 19 may be electrically connected to another reference potential, e.g. the positive or negative integrated circuit supply voltage. This will change the voltage at which the SCR cell will start to protect the circuit, i.e. the SCR cell's breakdown voltage.

FIG. 3 shows an equivalent electrical circuit of the structure of FIG. 2. The equivalent circuit comprises a protected pin 1 connected to the main integrated circuit structure 3. A first resistor 21 is connected between the protected pin 1 and the collector of a first transistor 26. The collector of the first transistor 26 is also connected to the base of a second transistor 22. The base of the first transistor 26 is connected to the collector of the second transistor 22. The emitter of the first transistor 26 is connected to a reference node 4 which has a reference potential, typically ground. The emitter of the second transistor 22 is connected to the integrated circuit structure 3 and to the protected pin 1. A second resistor 29 is connected between the collector of the second transistor 22 and the reference node 4. The first resistor 21 is formed by the first heavily doped N region 17 in combination with the lightly doped N-well 15. The first transistor 26 is formed by the N-well 15, the P type substrate 14 and the further heavily doped region 19 of N-type material, these forming the collector, base and emitter of the first transistor respectively. The second transistor 22 is formed by the heavily doped P-type region 16, the N-well 15 and the P-type substrate 14. The second resistor 29 is formed by the region of heavily doped N-type material 19. A typical operating characteristic for this device is shown in FIG. 4.

Normally the device operates in the high impedance region and no current flows through the protection device.

However, as the voltage across the SCR cell device reaches its breakdown voltage, a phenomenon known as "avalanche conduction" occurs in the first transistor 26. Avalanche conduction occurs when a sufficiently large negative voltage is applied to a semiconductor junction, the resulting electric field pulling electrons directly out of covalent bonds. The electron-hole pairs thus created then contribute a greatly increased reverse current. This current in turn causes the first transistor 26 to start to turn on, and the voltage across its collector-emitter to drop. This region is indicated by the breakdown region in FIG. 4. As the voltage across the first transistor 26 decreases, the voltage across the first resistor 21 increases. This increase in voltage provides a biasing current for the second transistor 22. As the voltage applied to the protected pin 1 increases further, the second transistor 22 starts to switch on. As the second transistor 22 switches on, it provides a biasing current for the base of the first transistor 26, which switches the first transistor 26 on completely. This point is indicated in FIG. 4 as the "turn-on" current. At this point, the SCR device switches to a very low impedance state, indicated in FIG. 4 as the low impedance region. The protection device will remain in this low impedance state until the current drops to a level where the current flowing through the first resistor 21 is insufficient to maintain the second transistor 22 biased on. If the current being supplied to the protected pin never falls below the holding current, the SCR protection cell will remain permanently in the on state. This can happen in situations where, for example, an external driver is used which can supply more current than the holding current. This occurrence is a form of latch-up, and will prevent the integrated circuit from returning to a normal operating state after an ESD discharge.

Thus, in summary, for the typical characteristic shown in FIG. 4 for an SCR cell, under normal operating conditions the SCR cell has a high impedance state, and accordingly little current flows through the cell. When the voltage across the SCR cell exceeds what is known as the breakdown voltage, the SCR cell starts to switch on and appreciable current starts to flow. When the current increases beyond a certain limit, referred to as the "turn-on current", the SCR cell switches on completely and the SCR cell enters its low impedance region. In this region, the SCR cell allows high currents to flow without significant voltage across the terminals. Hence an SCR cell can discharge an EOS event without itself sustaining any damage.

The SCR cell remains in the "on" (low impedance) state until the current is reduced to below the value known as the holding current. At this point the cell returns to its high impedance state.

One difficulty with existing SCR cells is that they are susceptible to the phenomenon known as "latch-up". This is where an SCR cell fails to return to the high impedance state and remains in the low impedance region.

A further problem with existing SCR cells (e.g. U.S. Pat. No. 4,939,616) is that they are unipolar, and thus only suitable for protecting against unipolar ESD transients. Two SCR cells in parallel and having reversed polarities are required to provide bipolar protection. Thus, two SCR cells are required for each input/output pin on an integrated circuit. Since space is frequently at a premium on integrated circuits, this may not always be a realistic option in many instances. It is an object of the present invention to provide an SCR cell capable of effecting bipolar protection.

A further difficulty with SCR cells is that care must be taken when implementing the cells to ensure they have the correct characteristics necessary for the intended application. In particular, the breakdown voltage and holding current must be tailored to meet the application. If the breakdown voltage is too low, the cell will leak current even under normal conditions. If the holding current is too low and the circuitry in parallel with the cell (such as an external driver or internal output driver) can source a current exceeding this, then the cell may never leave its low impedance state after an ESD event. The correct characteristics may also vary from pin to pin on an integrated circuit.

The characteristics of prior art SCR cells are largely determined by the levels of doping chosen for the different regions of the SCR cell. For example, U.S. Pat. No. 4,939,616 provides an input protection device with a low trigger threshold. However, the actual characteristics of the device are defined largely by the chosen doping levels. Once a particular semiconductor manufacturing process has been selected for manufacturing an integrated circuit, the designer of the integrated circuit is limited in the changes which can be made to the SCR cell to alter its operating characteristics, e.g. after development testing. In addition, the integrated circuit designer cannot have substantially differing characteristics for different SCR cells on a single integrated circuit. It is an object of the present invention to provide an SCR cell whose characteristics may be altered without changing the manufacturing process. In particular, it is an object of the present invention to be able to readily modify the layout of a device to alter its operating characteristics.

A further problem with existing SCR cell designs is that when they are used for protecting the pins of an integrated circuit and are incorporated within the integrated circuit, the characteristics of each cell are substantially similar in terms of breakdown voltage because the characteristics of the cells are largely determined by the semiconductor manufacturing process chosen. However, the normal operating regions of each pin and their safe operating regions will vary. For example, sensitive input circuitry may require a SCR cell with a lower breakdown voltage or a lower holding current cell than output driver circuitry. It is a further object of the present invention to provide a SCR cell design such that each pin on a integrated circuit can have a different characteristic protection cell so as to maximise performance of the integrated circuit while maintaining effective ESD protection.

BRIEF SUMMARY OF THE INVENTION

The present invention provides an ESD SCR cell combining many advantages of the prior art with additional features that allow tunability of cell specifications such as holding current or breakdown voltage without detrimental effect on ESD performance. "Tunability" enables the designer to alter the protection characteristics of a particular SCR cell on an integrated circuit without altering the characteristics of other SCR cells on the same integrated circuit. It will be immediately clear to anyone skilled in the art, however, that such alteration or tuning is performed prior to manufacture, at the design stage, and is not available once an integrated circuit has been fabricated. A bipolar implementation of an SCR cell is also provided.

According to the invention in a first aspect, an input protection device is provided for protecting a circuit structure which is coupled to a first node, the device comprising;

a first lightly-doped region having a first conductivity type;

a second lightly-doped region formed in said first lightly-doped region, said second lightly-doped again having a second conductivity type;

a first heavily-doped region formed in said second lightly-doped region, said first heavily-doped region having said second conductivity type and being electrically connected to said first node;

a second heavily-doped region formed in said second lightly-doped region, said second heavily-doped region having said first conductivity type and being electrically connected to said first node;

a third lightly-doped region formed in said first lightly-doped region, said third lightly-doped region having said second conductivity type and being at a spacing from said second lightly-doped region;

a third heavily-doped region formed in said third lightly-doped region, said third heavily-doped region having said first conductivity type and being electrically connected to a second node; and a fourth heavily-doped region formed in said third lightly-doped region, said fourth heavily-doped region having said second conductivity type, and being electrically connected to said second node.

In a second aspect of the invention, there is provided an input protection device for protecting a circuit structure which is coupled to a first node, the device comprising;

a first lightly-doped region having a first conductivity type;

a second lightly-doped region formed in said first lightly-doped region, said second lightly-doped region having a second conductivity type;

a first heavily-doped region formed in said second lightly-doped region, said first heavily-doped region having said second conductivity type and being electrically connected to said first node;

a second heavily-doped region formed in said second lightly-doped region, said second heavily-doped region having said first conductivity type and being electrically connected to said first node;

a third heavily-doped region formed in said first lightly-doped region, said third heavily-doped region having said second conductivity type, being at a spacing from the second lightly-doped region and being electrically connected to a second node; and a fourth heavily-doped region formed in said first lightly-doped region, said fourth heavily-doped region having said first conductivity type, being located between said second lightly-doped region and said third heavily-doped region and being electrically connected to said second node.

Preferably, the spacing between said first heavily-doped region and said third heavily-doped region is greater than the spacing between said second heavily-doped-region and said third heavily-doped region.

According to a third aspect of the invention, an input protection device is provided for protecting a circuit structure which is coupled to a first node, said device comprising;

a first lightly-doped region having a first conductivity type;

a second lightly-doped region formed in said first lightly-doped region, said second lightly-doped region having a second conductivity type;

a first heavily-doped region formed in said second lightly-doped region, said first heavily-doped region having said second conductivity type and being electrically connected to said first node;

a second heavily-doped region formed in said second lightly-doped region, said second heavily-doped region having said first conductivity type and being electrically connected to said first node;

a third lightly-doped region formed in said first lightly-doped region, said third lightly doped region having said second conductivity type and being at a spacing from said second lightly-doped region;

a third heavily-doped region formed in said third lightly-doped region, said third heavily-doped region having said first conductivity type and being electrically connected to a second node;

a fourth heavily-doped region formed in said third lightly-doped region, said fourth heavily-doped region having said second conductivity type and being electrically connected to said second node; and a fifth heavily-doped region formed in said first lightly-doped region, said fifth heavily-doped region having said first conductivity type and being at a spacing both from said second lightly-doped region and from said third lightly-doped region.

Preferably, the spacing between said first heavily-doped region and said third heavily-doped region is greater than the spacing between said second heavily-doped region and said third heavily-doped region and/or the spacing between said fifth heavily-doped region and said third heavily-doped region is greater than the spacing between said fourth heavily-doped region and said third heavily-doped region.

Preferably, the first lightly-doped region of the protection device according to any of the aspects of the invention described above is a well formed on a substrate of said second conductivity type. Optionally the substrate is an epitaxial (EPI) layer substrate.

At least one of the heavily-doped regions may be formed using locos enhancement.

In a favoured construction of the invention, the first lightly-doped region and the substrate of the input protection device are substantially separated by a layer of heavily-doped material of the first conductivity type.

Any of the input protection devices according to the invention may be fabricated on an integrated circuit or as a discrete device, with the first conductivity type as P and the second conductivity type as N or with the first conductivity type as N and the second conductivity type as P.

In an especially preferred arrangement, the protection device of the invention may be constructed so that its regions define a substantially annular layout in plan view.

In a further variant, the input protection device according to the invention may be formed in a region bounded by one or more isolation plugs. Preferably the or each isolation plug comprise a region of heavily-doped material, for example, of the second conductivity type, extending substantially from a surface portion of the device to a substrate region of the device.

In a particular construction of the invention in its third aspect, there is provided an input protection device fabricated on an integrated circuit for protecting a circuit structure which is coupled to a first node, comprising:

a first lightly-doped region of P-type material, said first lightly-doped region being formed as a well on a Epitaxial layer (EPI) substrate of N-type material, the first lightly-doped region and the EPI substrate being substantially separated by a layer of heavily-doped P-type material;

a second lightly-doped region of N-type material formed in said first lightly-doped region;

a first heavily-doped region of N-type material formed in said second lightly-doped region, said first heavily-doped region being electrically connected to said first node;

a second heavily-doped region of P-type material formed in said second lightly-doped region, said second heavily-doped region being electrically connected to said first node;

a third lightly-doped region of N-type formed in said first lightly-doped region, said third lightly-doped region being at a spacing from said second lightly-doped region;

a third heavily-doped region of P-type material formed in said third lightly-doped region, said third heavily-doped region being electrically connected to a second node;

a fourth heavily-doped region of N-type material formed in said third lightly-doped region, said fourth heavily-doped region being electrically connected to said second node;

a fifth heavily-doped region of P-type material formed in said first lightly-doped region, said fifth heavily-doped region being at a spacing both from said second lightly-doped region and from said third lightly-doped region; and at least one isolation plug bounding said device, the or each isolation plug comprising a region of heavily doped N-type material, extending substantially from a surface portion of the device to the EPI substrate;

the spacing between said first heavily-doped region and said third heavily-doped region being greater than the spacing between said second heavily-doped region and said third heavily-doped region and the spacing between said fifth heavily-doped region and said third heavily-doped region being greater than the spacing between said fourth heavily-doped region and said third heavily-doped region.

BRIEF DESCRIPTION OF THE DRAWINGS

For a better understanding of the present invention, reference is made to the drawings, which are incorporated herein by reference and in which:

FIG. 11 is a plan view of an annular construction of the bipolar embodiment of FIG. 9.

DETAILED DESCRIPTION OF THE DRAWINGS

Prior art FIGS. 1 to 4 to have already been discussed in section headed "Description of the Prior art".

Figure 1:
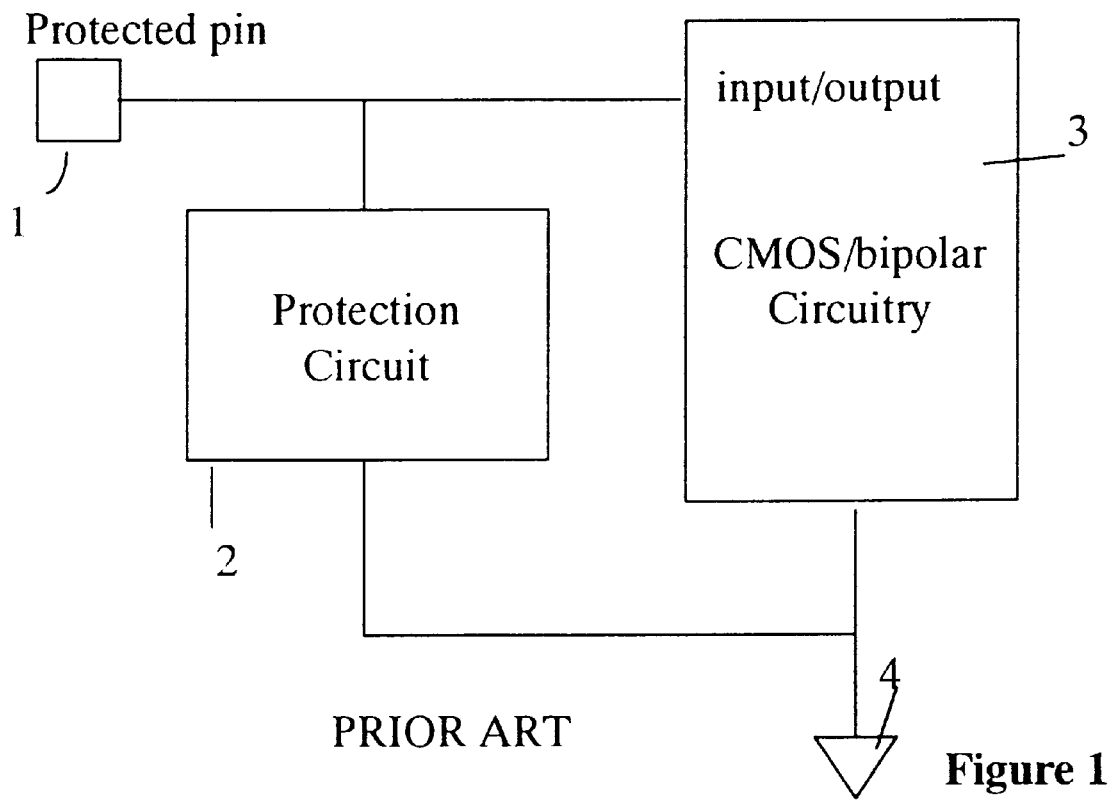
FIG. 1 is a block diagram of a typical arrangement known in the art for an ESD protection circuit.
Figure 2:
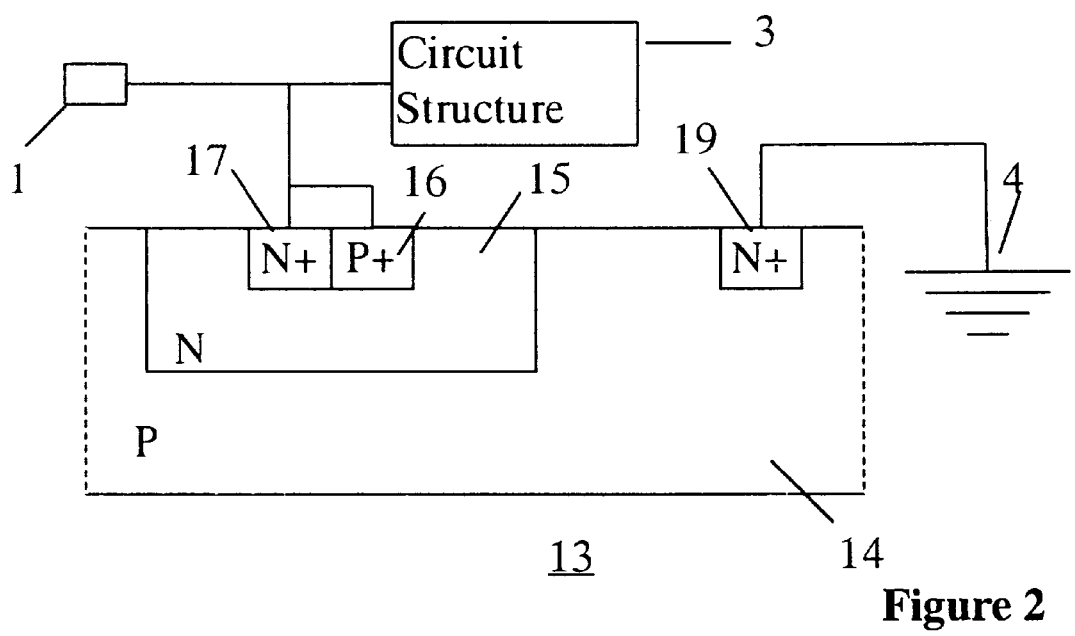
FIG. 2 is a side view representation of a prior art SCR type protection device.
Figure 3:
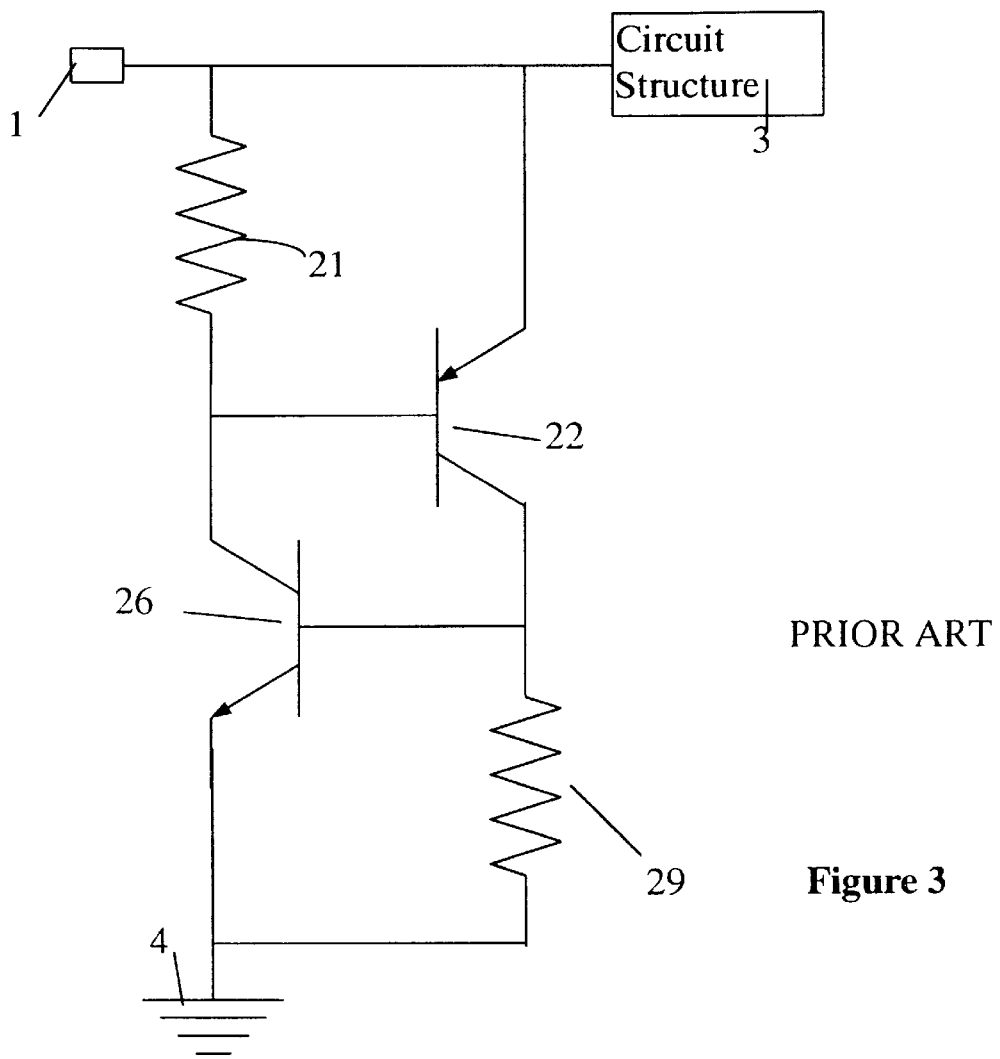
FIG. 3 is an equivalent schematic diagram of the prior art device of FIG. 2.
Figure 4:
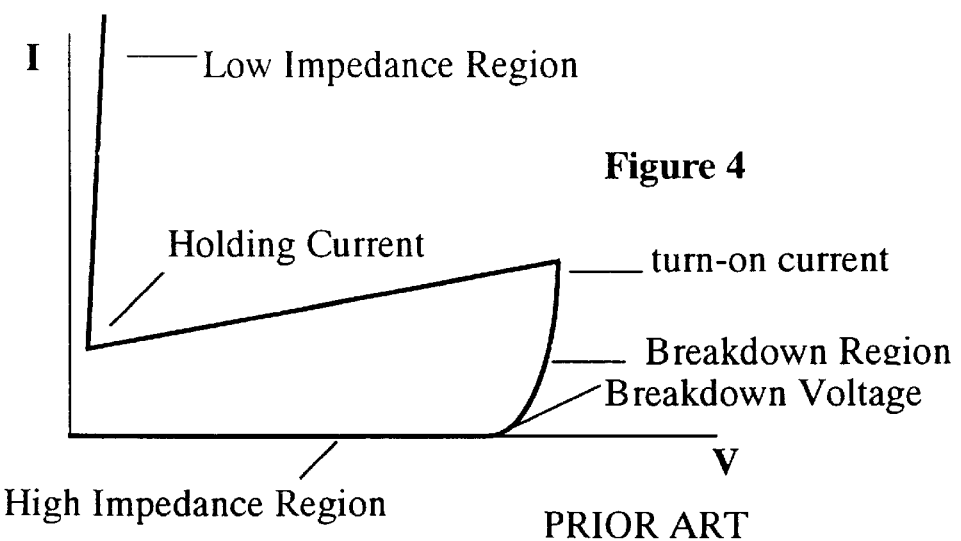
FIG. 4 is a graph depicting a typical voltage-current relationship for the SCR type input protection device of FIG. 2.
Figure 5:
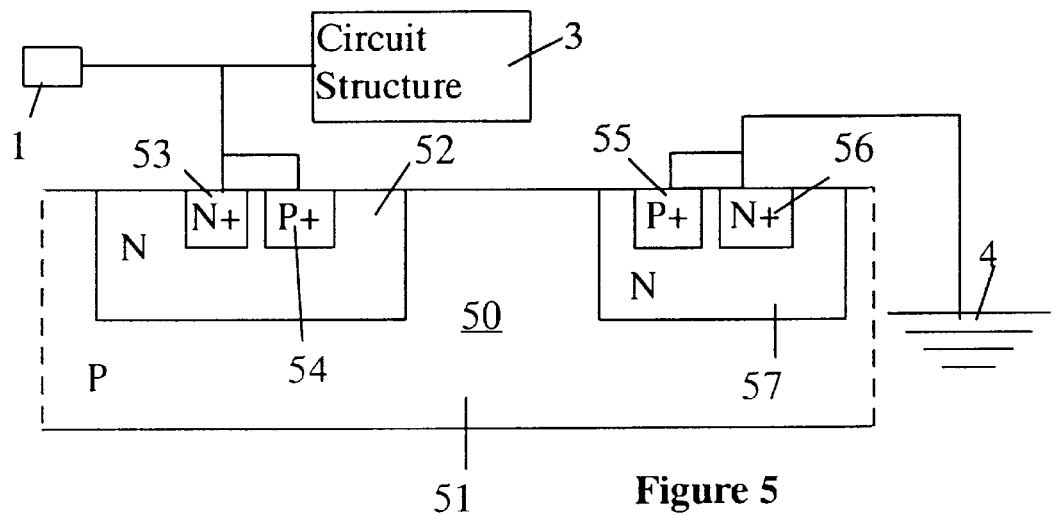
FIG. 5 is a side view representation of one embodiment of the present invention.

FIG. 5 is a side view schematic diagram showing one embodiment of the present invention, specifically a bipolar SCR structure. This bipolar SCR protection device 50 is formed in a P-type silicon semiconductor substrate 51. Two lightly doped N-wells 52, 57 are formed in the substrate 51 at a spacing from one another. Two regions 53, 54 of heavily doped material are formed in the first well 52, the first region 53 of N-type material and the second region 54 of P-type material. As shown in FIG. 5. the first region 53 of N-type material and the second region 54 of P-type material may be separated by a region of the first well 52. A further two regions 55, 56 of heavily doped material are formed in the second well 57, the first 55 of P-type material and the second 56 of N-type material. The two further regions 55, 56 may be separated by a region of the second well 57, again as shown in FIG. 5.

Figure 6:
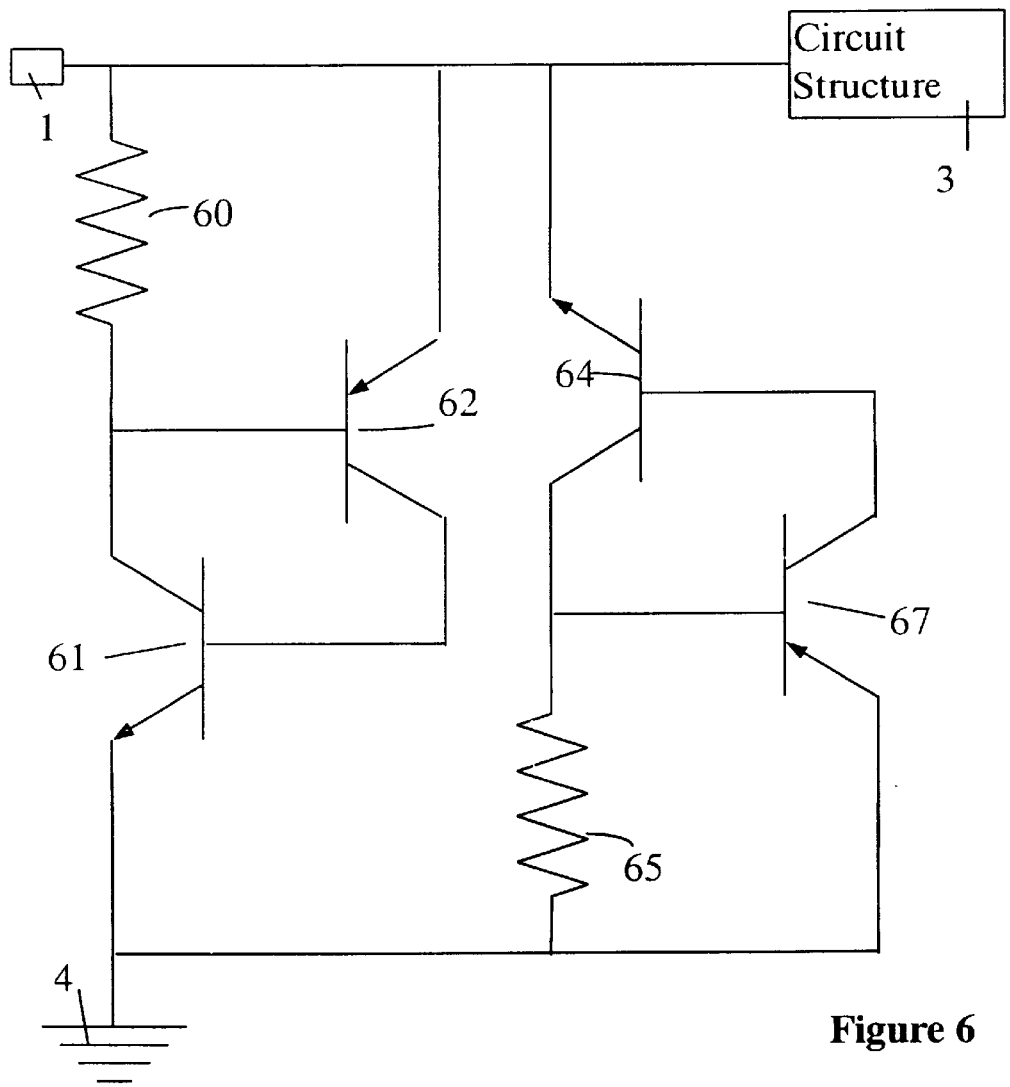
FIG. 6 is an equivalent schematic diagram of the embodiment of FIG. 5.

An equivalent electrical schematic diagram of the structure of FIG. 5 is shown in FIG. 6. The circuit provides for both positive and negative ESD events. The equivalent circuit comprises a first resistor 60 connected between a protected pin 1 and the base of first transistor 62. The protected pin 1 is further connected to an integrated circuit structure 3. The first transistor 62 has its emitter connected to the protected pin 1. A second transistor 61 has its collector connected to the first resistor 60 and to the base of the first transistor 62, its base connected to the collector of the first transistor 62 and its emitter connected to a reference node 4 having a reference potential (suitably ground). The circuit further comprises a second resistor 65 connected between the reference node 4 and the base of a fourth transistor 67. The emitter of the fourth transistor 67 is connected to the reference node 4. A third transistor 64 has its collector connected to the base of the fourth transistor 67, its base connected to the collector of the fourth transistor 67 and its emitter connected to the protected pin 1. In operation of the protection arrangement, the first resistor 60, the first transistor 62 and the second transistor 61 function during a positive transient, while the second resistor 65, third transistor 64 and fourth transistor 67 operate during negative transients.

The first resistor 60 is formed by the N-type regions or diffusions 53 and 52. The first transistor 62 is formed by the heavily doped diffusion 54, the first well 52 and the substrate 51, these defining respectively the emitter, base and collector of the transistor 62. The second transistor 61 is formed by the first well 52, the substrate 51 and the second well 57. The third transistor is formed by the second well 57, the P-type diffusion 51, and the first well 52, these providing the collector, base and emitter respectively of the third transistor. The fourth transistor 67 is formed by the P-type diffusion 51, the N-type diffusion 57 and the P-type diffusion 55, these comprising respectively the collector, base and emitter of the fourth transistor. The second resistor 65 is defined by the N-type diffusions 57 and 56.

During a positive over-voltage condition, the first resistor 60, first transistor 62 and second transistor 61 act so as to form an SCR protective device, whereas, in the presence of a negative over-voltage condition, the third transistor 64, fourth transistor 67 and second resistor 65 combine to act as an SCR protective device. In operation, the first and second transistors 62, 61 switch on during a positive ESD event, whereas in a negative ESD event, the third and fourth transistors 64, 67 switch on. The operation of the circuit is similar in either case. To explain the circuit further, consider a negative over-voltage condition. As the negative voltage applied to the protected pin 1 increases, the third transistor 64 enters its breakdown region and conduction starts to occur. This conduction creates a voltage across the second resistor 65 which in turn initiates turn-on of the fourth transistor 67. If the voltage applied to the protected pin increases further, then the voltage across the second resistor 65 will increase and the fourth transistor 67 will switch on completely. The fourth transistor switching on in turn provides a biasing current for the third transistor, which will also turn on completely. Once both transistors have switched on, a low impedance path is formed between the protected pin and ground, dissipating the overvoltage condition. The circuit operates in a similar manner for a positive overstress voltage, except that the first transistor 62 and second transistor 61 will switch on instead of the third transistor 64 and fourth transistor 67. Thus a protective SCR input circuit is provided which can handle both positive and negative (bipolar) transients without requiring two individual SCR cells. The space requirement for input protection circuitry on an integrated circuit or using discrete devices on a printed circuit board is thus significantly reduced.

Figure 7:
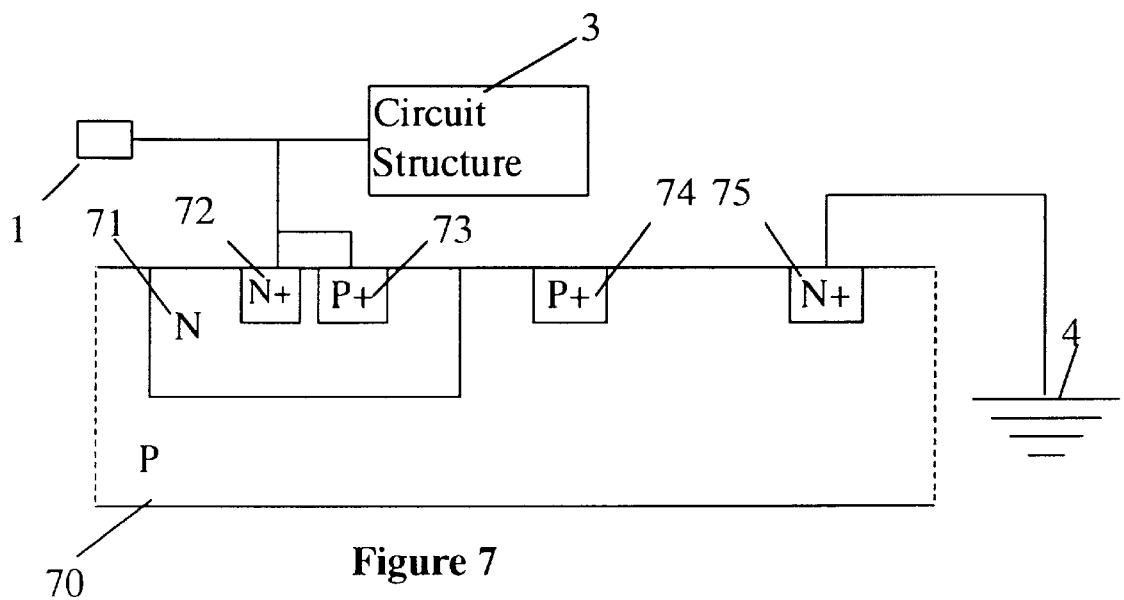
FIG. 7 is a side view representation of a further embodiment of the present invention.

FIG. 7 shows a side schematic view of a further embodiment of the present invention, which is a unipolar SCR device. This device consists of a P-type substrate 70 having a lightly doped N-type well 71 formed in it. Two regions 72, 73 of heavily doped material are formed in the N-type well 71. The first region 72 is formed of N-type material and the second region 73 of P-type material. The first and second regions 72, 73 of heavily doped material may be separated by a region of the lightly doped N-type well, as shown in FIG. 7. Two further regions 74, 75 of heavily doped material are formed in the substrate 70 at a spacing from the N-well 71 and from each other. The first region 74 is formed from P type material. The second region 75 is formed of N type material. This latter region 75 is electrically connected to ground or other reference potential. The heavily doped N-type 72 and P-type 73 type diffusions in the N well 71 are electrically connected to the protected pin 1 and to the circuit structure 3.

Figure 8:
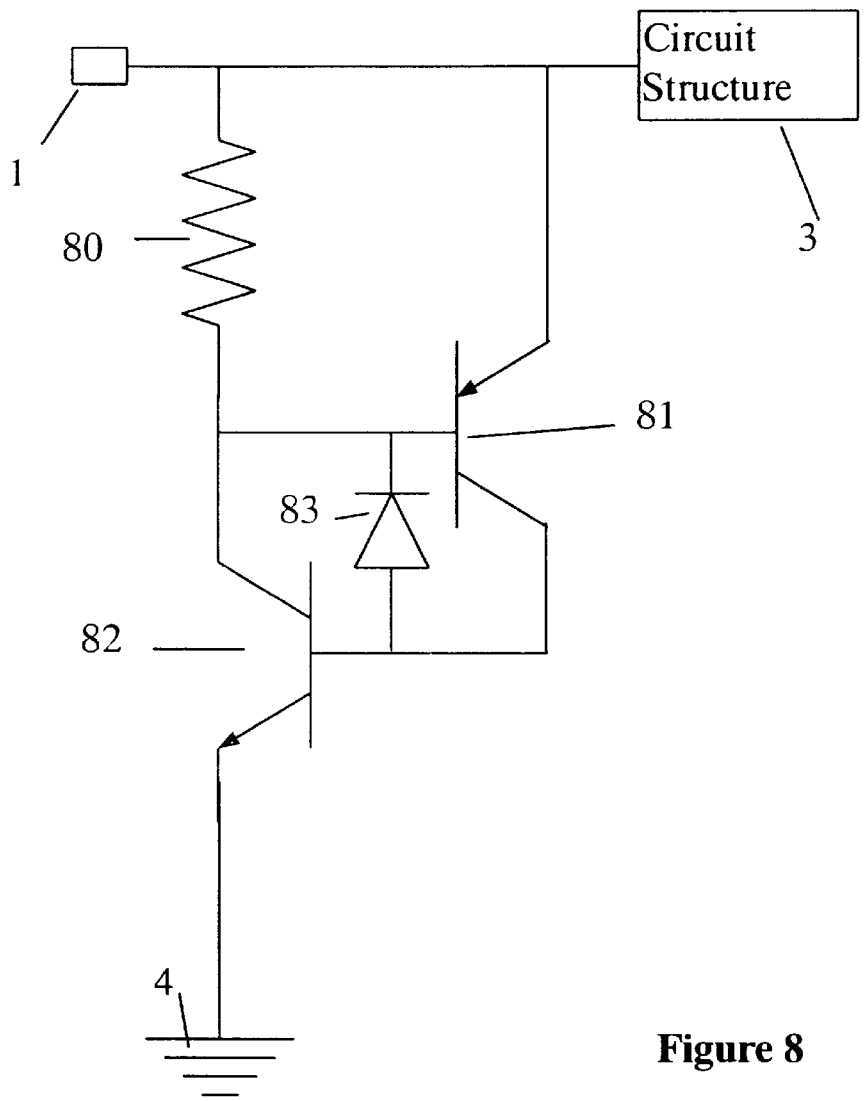
FIG. 8 is an equivalent schematic diagram of the embodiment of FIG. 7.

An equivalent schematic diagram circuit for FIG. 7 is shown in FIG. 8. This equivalent circuit comprises a first resistor 80, a first transistor 81, a second transistor 82, a protected pin 1, an integrated circuit structure 3, a reference node 4 and a diode 83. The protected pin 1 is connected to the first resistor 80, to the integrated circuit structure 3 and to the first transistor 81. The first resistor 80 is connected between pin 1 and the base of the first transistor 81, which is also connected to the cathode of the diode 83 and to the collector of the second transistor 82. The anode of the diode 83 is connected to the base of the second transistor 82 and to the collector of the first transistor 81. The first resistor 80 is formed by the N type diffusion 72 and N-well 71. The first transistor 81 is formed by the P type diffusion 73, the N type diffusion 71 and the P type substrate 70, these defining respectively the emitter, base and collector of the transistor 81. The second transistor 82 is formed by the N well 71, the P type substrate 70 and the N type diffusion 75, these providing respectively the collector, base and emitter of the second transistor 82. The diode 83 is formed by the junction of the N type diffusion 71 with the P substrate 70 in combination with the heavily doped P region 74.

The diode 83 alters the characteristics of the present embodiment of the invention from those of prior art devices. In the present embodiment, it is the characteristic of "avalanche breakdown" (explained below) of the diode 83 rather than the breakdown of the second transistor 82 that initiates the SCR action.

During normal operation, the circuit presents a high impedance path from protected pin 1 to ground 4. During a positive ESD event, the voltage on the pin 1 increases and causes the depletion region between diffusions 71 and 70 to widen until, at some critical potential, the "breakdown voltage", the depletion region extends to meet the P type diffusion 74. At this point, the dramatic change in diffusion density causes electrons to be freed, resulting in a current flowing from the N well 71 to the P substrate 70. This breakdown is known as "avalanche breakdown". The resulting current flow through the diode 83 causes a current to flow through the first resistor 80, thereby increasing the potential across the base-emitter junction of the first transistor 81, which causes the first transistor 81 to switch on. The turning on of the first transistor 81 turns on the second transistor 82 and the protection circuit enters a low impedance SCR mode, allowing large currents to flow through the first and second transistors 81, 82 with very little voltage drop from the protected pin 1 to the reference node 4. The SCR switches off when the current supplied to the SCR reduces to a level known as the holding current.

By minimising the resistance of the first resistor 80, (for example by altering the dimensions of the N well 71 or those of the heavily doped N region 72), the current required to flow through the circuit before SCR action is initiated is maximised. Due to the localisation of current flow and transistor action, the current required to turn off the SCR is lower than the current required to turn it on.

A particular advantage of this cell structure is that the breakdown voltage may be altered by increasing or decreasing the distance between the N well 71 and the heavily doped P region 74. The breakdown voltage is reduced by reducing the distance between the N-well 71 and the P-type region 74 and the breakdown voltage is increased by increasing the distance between the N-well 71 and the P-type region 74.

To maximise ESD performance, the heavily doped P-type diffusion 74 should preferably be located closer to the second heavily doped P-type diffusion 73 than it is to the N type diffusion 72. However, the device will work in a variety of configurations.

An annular shape of the device in plan view enables ESD robustness to be increased. However, a half annular structure may suffice without detriment to performance.

Thus an SCR cell is provided whose operating characteristics may be altered by changing its layout rather than its diffusion levels. Accordingly, an IC may be provided with each pin of the IC protected by a SCR cell, wherein the characteristics of each SCR cell are tuned to the operating region of its corresponding pin.

Figure 9:
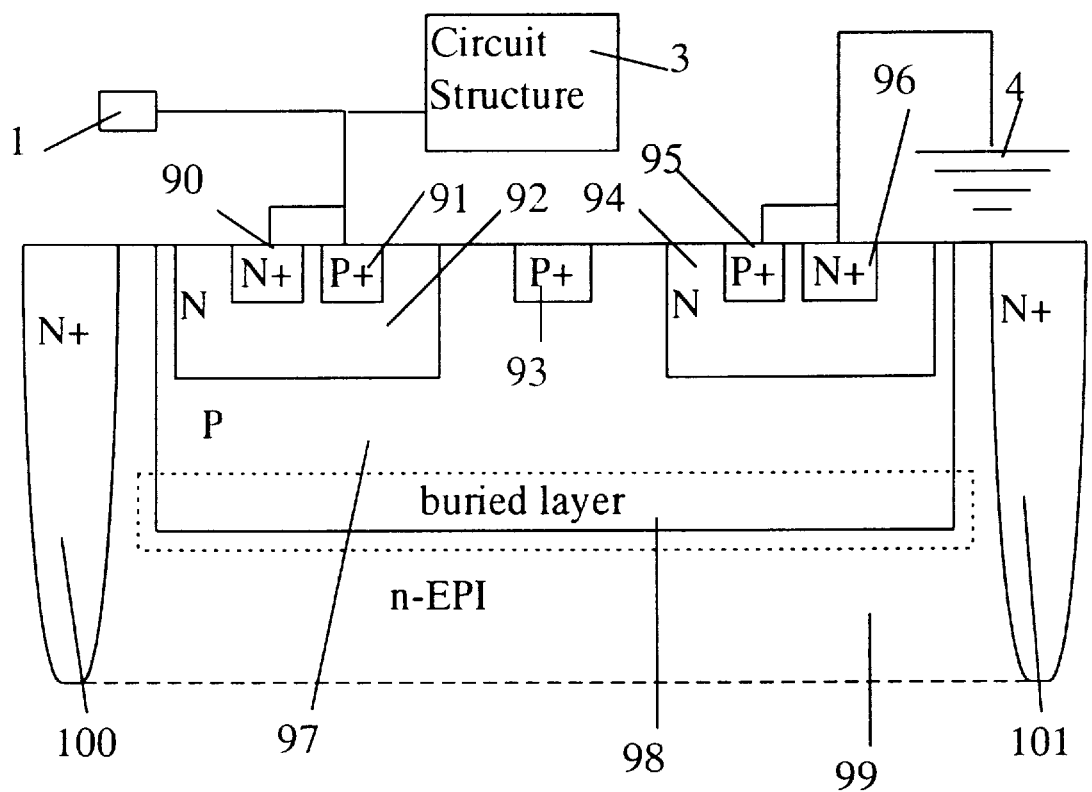
FIG. 9 is a side view representation of a bipolar embodiment of FIG. 7.

A further embodiment is shown in FIG. 9. This embodiment combines the bipolar structure of the embodiment of FIG. 5 with the alterable characteristic features of FIG. 7.

The device consists of a lightly doped P-type well 97 having first and second lightly doped N-type wells 92, 94, spaced apart from each other, formed in it. Two regions 90, 91 of heavily doped material are formed in the first N-type well. The first regions 90 is formed of N-type material and the second region 91 of P-type material. As shown in FIG. 9, the first and second regions of heavily doped material may be separated by a portion of the first N-type well. The two heavily doped regions 90, 91 are electrically connected to the protected pin 1 and to the circuit structure 3. Two further regions 95, 96 of heavily doped material are formed in the second N-type well 94. The two further regions of heavily doped material may be separated by a portion of the second N-type well, again as shown in FIG. 9. The first of these further regions 95 is formed from P-type material. The second 96 is formed of N-type material. These two further regions 95, 96 are electrically connected to ground or other reference 4. A further heavily doped region 93 of P-type material is formed in the P well 97 between the first and second N wells 92, 94.

Figure 10:
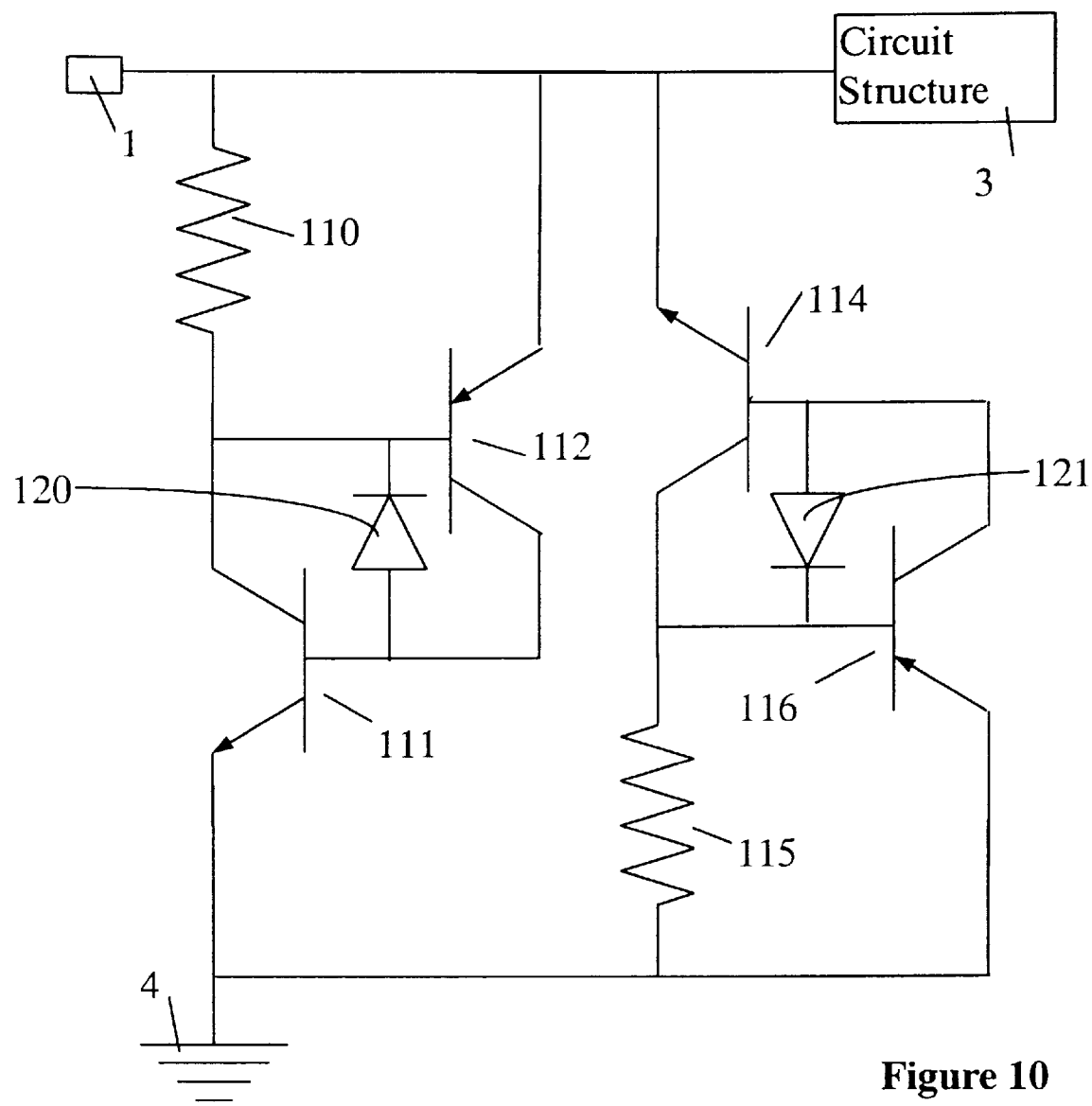
FIG. 10 is an equivalent schematic diagram of the bipolar embodiment of FIG. 9.

An equivalent schematic diagram circuit of this arrangement is shown in FIG. 10. The equivalent schematic diagram shows the equivalent circuit for both positive and negative ESD events. The circuit comprises a protected pin 1, a main circuit structure 3, a first resistor 110, a second resistor 115, a first diode 120, a second diode 121, a first transistor 112, a second transistor 111, a third transistor 114 and a fourth transistor 116. The protected pin is connected to the first resistor 110, to the main circuit structure 3, to the emitter of the first transistor 112 and to the emitter of the third transistor 114. The first resistor 110 is connected between the protected pin and the cathode of the first diode 120. The cathode of the first diode 120 is also connected to the base of the first transistor 112 and to the collector of the second transistor 111. The anode of the first diode 120 is connected to the collector of the first transistor 112 and to the base of the second transistor 111. The emitter of the second transistor is connected to the reference node 4. The reference node 4 is also connected to the second resistor 115 and to the emitter of the fourth transistor 116. The second resistor 115 is connected between the reference node 4 and the cathode of the second diode 121. The cathode of the second diode 121 is also connected to the base of the fourth transistor 116 and to the collector of the third transistor 114. The anode of the second diode 121 is connected to the base of the third transistor 114 and to the collector of the fourth transistor 116. In operation, the first resistor 110, first diode 120, first transistor 112 and second transistor 111 function during a positive transient, whereas the second resistor 115, second diode 121, third transistor 116 and fourth transistor 114 are activated during negative transients.

The first resistor 110 is formed by the N-type diffusion 90 and the first N well 92. The first transistor 112 is formed by the heavily doped P diffusion 91, the first well 92 and the P well 97, these forming respectively the emitter, base and collector of the first transistor 112. The second transistor 111 is formed by the first well 92, the P well 97 and the second N well 94. The first diode 120 is formed from the junction of the first N well 92 and P well 97, and its characteristic is affected by the further region 93 of heavily doped P type material. The third transistor 114 is formed by the second well 94, the P-type well 97 and the first N well 92, these forming the collector, base and emitter respectively of the third transistor 114. The fourth transistor 116 is formed from the P-type diffusion 97, the second N-type well 94 and the P-type region 95, these comprising respectively the collector, base and emitter of the transistor. The second resistor 115 arises from the N-type well 94 in combination with the heavily doped N region 96. The second diode 121 is formed from the combination of the P well 97, the heavily doped P region 93 and the second N well 94.

During a positive over-voltage condition, the first resistor 110, first diode 120, first transistor 112 and second transistor 111 act so as to form an SCR protective device, whereas with a negative over-voltage condition, the second diode 121, third transistor 114, fourth transistor 116 and second resistor 115 combine to act as an SCR device. In operation, the first and second transistors will switch on during a positive ESD event, whereas in a negative ESD event the third and fourth transistor switch on. The operation of the circuit is similar in either case and is effectively similar to the operation of the unipolar SCR embodiment hereinbefore described and illustrated in FIG. 7. For explanation purposes, consider a positive over-voltage condition. As the voltage on the protected pin 1 increases, the depletion region between the first N well diffusion 92 and the P well diffusion 97 widens, until, at some critical potential, the "breakdown voltage", it extends to meet the heavily doped P type diffusion 93. At this point, avalanche breakdown of the first diode 120 occurs, and the resulting current flow through the first resistor 110 increases the potential across the base-emitter junction of the first transistor 112, causing the first transistor 112 to switch on. The first transistor 112 turning on provides a biasing current to the base of the second transistor 111, which turns on, and the protection device enters its low impedance SCR mode, allowing large currents to flow through the first and second transistors 112, 111 with very little voltage drop between the protected pin and the reference node 4 (ground). The device will leave its low impedance SCR mode when the current supplied to the SCR reduces to a level below the holding current.

The breakdown voltage of the device for positive overvoltage conditions is dependent on the distance between the first N well 92 and the highly doped P region 93, whereas the breakdown voltage for negative overvoltage conditions is dependent on the distance between the second N well 94 and the highly doped P region 93. For equal positive and negative characteristics, the two distances should be equal. However, by altering the distances and the ratio between them, the device characteristics may be optimised for the particular operating conditions of a device or for individual pins of an integrated circuit.

The cross section through the cell shown in FIG. 9 also shows optional diffusions that prevent parasitics from affecting circuitry performance and also inhibit latchup. An EPI layer 99 is formed on an underlying wafer. In general, EPI layer substrates are formed by starting with a highly doped wafer on which a layer of material of the same type, with a doping density similar to normal wafers, is grown. Diffusion layer 98 is a buried layer established at the bottom of the P well 97. Its function is to reduce the effects of parasitic transistors formed by the EPI layer substrate 99, the P well 97 and either of the N wells 92, 94, during or after the breakdown region of cell operation. Isolation plug portions 100, 101 prevent parasitic latchup from other parts of the circuitry, as does the Epitaxial layer (EPI) layer 99. The use of these further optional diffusions also ensures that the protection device effectively floats with respect to other parts of the integrated circuit. Thus the voltages on the cells may exceed the supply voltages without the danger of parasitic latch up.

Locos are holes formed in the thick oxide layer covering the wafer. To diffuse p+ or n+, a locos area must first be created. A region of this locos area, called the diffusion area, is then implanted with a chosen doping level, after which the wafer is baked at a high temperature. The high temperature diffuses the p+ (or n+) material into the underlying wafer. The depth of diffusion is dependent on the thickness of the oxide. The thicker the oxide the deeper the diffusion. Normally, the locos area is larger than the diffusion area, this resulting in a uniform diffusion depth. It has been found experimentally that the use of locos enhancement increases the holding current. Locos enhancement is where the locos and diffusion areas are the same size. This causes thick oxide at the edges of the diffusion making for a non-uniform cross sectional depth. The diffusion will be deepest at the edges and shallower in the centre, an effect which increases the holding current.

A device may however be constructed without any of these optional diffusions and without the EPI layer substrate, as in the embodiments illustrated in FIGS. 5 and 7, or using a combination of one or more of these features. One or more of these optional features may also equally be applied to the embodiments shown in FIGS. 5 and 7.

It has been found experimentally that, to maximise ESD performance of SCR cells, the heavily doped P diffusions formed in the N wells should be positioned closer to the heavily doped P diffusion formed in the P well than the heavily doped N diffusions. As shown in FIG. 9 therefore, for example, the "P+" regions in the N-walls are located between the "N+" regions in these wells and the "P+" region in the P-well. An annular shape of the diffusions in plan view also increases ESD robustness. A plan view of the embodiment of FIG. 9 in an annular arrangement is illustrated in FIG. 11. The structure is arranged with a section of the first N-well 92 in the center of the structure. This is followed by a succession of annular regions extending from the central portion of the first N-well 92 outwards. These regions comprise in order; the region of N+ material 90 formed in the first N-well, the region of P+ material 91 formed in the first N-well, a second region of the first N-well 92, a first region of the P-well 97, the region of P+ material 93 formed in the P-well 97, a second region of the P-well 97, a first region of the second N-well 94, the region of P+ material 95 formed in the second N-well, the region of N+ material 96 formed in the second N-well 94, a second region of the second N-well 94, and a third region of the P-well 97, a region of the N type EPI substrate 99. Finally, the whole structure is surrounded by the isolation plug 100,101. An optional region of the first N-well may be provided between the N+ and P+ regions and an optional region of the second N-well may be provided between the N+ and P+ regions, as shown in the cross-sections of FIGS. 5, 7 and 9. In addition, the tracks and contacts for providing electrical connections to and from the structure have been omitted to simplify the diagram.

It should be noted that a half annular structure, which is readily derivable from the annular shape (essentially the annular structure divided in two but surrounded by the N substrate and isolation plug), will suffice without detriment to performance.

Having thus described several illustrative embodiments of the invention, various alterations, modifications, and improvements will be apparent to those skilled in the art. Such alterations, modifications, and improvements are intended to be encompassed within the scope and spirit of the invention. For example, it will be clear that the doping polarities may be altered such that each N type region becomes a P type and each P type region an N type. This alteration will produce identical protection devices for bipolar embodiments or opposite polarity for unipolar devices. In addition, it is clear that while the described embodiments are utilised in conjunction with integrated circuits, the present invention is not limited to integrated circuitry in any way and may advantageously provide over-voltage protection for discrete type devices. Accordingly, the foregoing description is by way of example only and is not intended as limiting. The present invention is only limited by the claims appended hereto and their equivalents.

What is claimed is:

1. An input protection device for protecting a circuit structure which is coupled to a first node, said device comprising:
   a first lightly-doped region having a first conductivity type;
   a second lightly-doped region formed in said first lightly-doped region, said second lightly-doped region having a second conductivity type;
   a first heavily-doped region formed in said second lightly-doped region, said first heavily-doped region having said second conductivity type and being electrically connected to said first node;
   a second heavily-doped region formed in said second lightly-doped region, said second heavily-doped region having said first conductivity type and being electrically connected to said first node;
   a third heavily-doped region formed in said first lightly-doped region, said third heavily-doped region having said second conductivity type, being at a spacing from the second lightly-doped region and being electrically connected to a second node; and
   a fourth heavily-doped isolated region formed in said first lightly-doped region, said fourth heavily-doped region having said first conductivity type, and being located between said second lightly-doped region and said third heavily-doped region, wherein relative proximity of said fourth heavily-doped region to said second lightly-doped region establishes an operating parameter for said input protection device.

2. The input protection circuit of claim 1, wherein the spacing between said first heavily-doped region and said third heavily-doped region is greater than the spacing between said second heavily-doped-region and said third-heavily-doped region.

3. The input protection device of claim 2, fabricated on an integrated circuit.

4. The input protection device of claim 3, wherein the first lightly-doped region is a well formed on a substrate of said second conductivity type.

5. The input protection device of claim 4, wherein at least one of said first, second, third and fourth heavily-doped regions is formed using locos enhancement.

6. The input protection device of claim 4, wherein the substrate is an Epitaxial layer (EPI) substrate.

7. The input protection device of claim 6, wherein the first lightly-doped region and the EPI substrate are substantially separated by a layer of heavily-doped material of the first conductivity type.

8. The input protection device of claim 7, comprised in a region bounded by one or more isolation plugs.

9. The input protection device of claim 8, wherein the or each isolation plugs comprises a region of heavily-doped material of the second conductivity type extending substantially from a surface of the device to the EPI substrate.

10. The input protection device of claim 9, wherein said regions define a substantially annular layout in plan view.

11. The input protection device of claim 1, wherein the first conductivity type is P and the second conductivity type is N.

12. The input protection device of claim 1, wherein the first conductivity type is N and the second conductivity type is P.

13. The input protection device of claim 1, fabricated as a discrete device.

14. The input protection device of claim 1, wherein the operating parameter for said input protection device comprises breakdown voltage.

15. An input protection device for protecting a circuit structure which is coupled to a first node, said device comprising:
   a first lightly-doped region having a first conductivity type;
   a second lightly-doped region formed in said first lightly-doped region, said second lightly-doped region having a second conductivity type;
   a first heavily-doped region formed in said second lightly-doped region, said first heavily-doped region having said second conductivity type and being electrically connected to said first node;

a second heavily-doped region formed in said second lightly-doped region, said second heavily-doped region having said first conductivity type and being electrically connected to said first node;

a third lightly-doped region formed in said first lightly-doped region, said third lightly-doped region having said second conductivity type and being at a spacing from said second lightly-doped region;

a third heavily-doped region formed in said third lightly-doped region, said third heavily-doped region having said first conductivity type and being electrically connected to a second node;

a fourth heavily-doped region formed in said third lightly-doped region, said fourth heavily-doped region having said second conductivity type and being electrically connected to said second node; and a fifth heavily-doped isolated region formed in said first lightly-doped region, interposed between and spaced apart from said second lightly-doped region and said third lightly-doped region, said fifth lightly-doped region having said first conductivity type, wherein relative position of said fifth heavily-doped region with respect to said second and third lightly-doped regions establishes operating parameters for said input protection device.

16. The input protection circuit of claim 15, wherein the spacing between said first heavily-doped region and said third heavily-doped region is greater than the spacing between said second heavily-doped region and said third heavily-doped region.

17. The input protection circuit of claim 16, wherein the spacing between said fifth heavily-doped region and said third heavily-doped region is greater than the spacing between said fourth heavily-doped region and said third heavily-doped region.

18. The input protection device of claim 17, fabricated on an integrated circuit.

19. The input protection device of claim 18, wherein said first lightly-doped region is a well formed on a substrate of said second conductivity type.

20. The input protection device of claim 19, wherein at least one of said first, second, third, fourth and fifth heavily-doped regions is formed using locos enhancement.

21. The input protection device of claim 19, wherein the substrate is an Epitaxial layer (EPI) substrate.

22. The input protection device of claim 21, wherein the first lightly-doped region and the EPI substrate are substantially separated by a layer of heavily-doped material of the first conductivity type.

23. The input protection device of claim 22, comprised in a region bounded by one or more isolation plugs.

24. The input protection device of claim 23, wherein the or each isolation plug comprises a region of heavily-doped material of the second conductivity type extending substantially from a surface portion of the device to the EPI substrate.

25. The input protection device of claim 15, wherein said regions define a substantially annular layout in plan view.

26. The input protection device of claim 15, wherein the first conductivity type is P and the second conductivity type is N.

27. The input protection device of claim 15, wherein the first conductivity type is N and the second conductivity type is P.

28. The input protection device of claim 15, fabricated as a discrete device.

29. The input protection device of claim 15, wherein the operating parameters for said input protection device comprise breakdown voltages.

30. An input protection device fabricated on an integrated circuit for protecting a circuit structure which is coupled to a first node, said device comprising:

a first lightly-doped region of P-type material, said first lightly-doped region formed as a well on an Epitaxial layer (EPI) substrate of N-type material, the first lightly-doped region and the EPI substrate being substantially separated by a layer of heavily-doped P-type material;

a second lightly-doped region of N-type material formed in said first lightly-doped region;

a first heavily-doped region of N-type material formed in said second lightly-doped region, said first heavily-doped region being electrically connected to said first node;

a second heavily-doped region of P-type material formed in said second lightly-doped region, said second heavily-doped region being electrically connected to said first node;

a third lightly-doped region of N-type material formed in said first lightly-doped region, said third lightly-doped region being at a spacing from said second lightly-doped region;

a third heavily-doped region of P-type material formed in said third lightly-doped region, said third heavily-doped region being electrically connected to a second node;

a fourth heavily-doped region of N-type material formed in said third lightly-doped region, said fourth heavily-doped region being electrically connected to said second node;

a fifth heavily-doped isolated region of P-type material formed in said first lightly-doped region, interposed between and spaced apart from said second lightly-doped region and said third lightly-doped region, wherein relative position of said fifth heavily-doped region with respect to said second and third lightly-doped regions establishes operating parameters for said input protection device; and at least one isolation plug bounding said device, said at least one isolation plug comprising a region of heavily doped N-type material extending substantially from a surface portion of the device to the EPI substrate;

the spacing between said first heavily-doped region and said third heavily-doped region being greater than the spacing between said second heavily-doped region and said third heavily-doped region, and the spacing between said fifth heavily-doped region and said third heavily-doped region being greater than the spacing between said fourth heavily-doped region and said third heavily-doped region.

31. The input protection device of claim 30, wherein the operating parameters for said input protection device comprise breakdown voltages.

* * * * *